(12) United States Patent
Malvern et al.

(10) Patent No.: US 11,340,248 B2
(45) Date of Patent: May 24, 2022

(54) SENSOR PACKAGES

(71) Applicant: Atlantic Inertial Systems Limited, Plymouth (GB)

(72) Inventors: Alan Malvern, Plymouth (GB); Kiran Harish, Plymouth (GB)

(73) Assignee: ATLANTIC INERTIAL SYSTEMS LIMITED, Plymouth (GB)

( * ) Notice: Subject to any disclaimer, the term of this patent is extended or adjusted under 35 U.S.C. 154(b) by 143 days.

(21) Appl. No.: 16/511,433

(22) Filed: Jul. 15, 2019

(65) Prior Publication Data

US 2020/0025786 A1    Jan. 23, 2020

(30) Foreign Application Priority Data

Jul. 20, 2018  (GB) ...................................... 1811925

(51) Int. Cl.
*G01P 1/02* (2006.01)
*G01P 1/00* (2006.01)

(52) U.S. Cl.
CPC .............. *G01P 1/023* (2013.01); *G01P 1/003* (2013.01)

(58) Field of Classification Search
CPC ................................ G01P 1/003; G01P 1/0023
See application file for complete search history.

(56) References Cited

U.S. PATENT DOCUMENTS

| 2005/0166677 A1 | 8/2005 | Nasiri et al. |
| 2012/0130671 A1 | 5/2012 | Horning |
| 2013/0264755 A1 | 10/2013 | Eskridge |
| 2016/0090297 A1 | 3/2016 | Zhang et al. |
| 2016/0370403 A1 | 12/2016 | Merdassi et al. |
| 2017/0176278 A1 | 6/2017 | Chen et al. |
| 2017/0305740 A1 | 10/2017 | Zunft |
| 2018/0003503 A1 | 1/2018 | Haubold |

FOREIGN PATENT DOCUMENTS

| KR | 2005070403 A | 7/2005 |
| WO | 0055638 A1 | 9/2000 |

OTHER PUBLICATIONS

Extended European Search Report for International Application No. 19187276.1 dated Nov. 7, 2019, 9 pages.
Intellectual Property Office Search and Examination Report for International Application No. 1811925.5 dated Jan. 18, 2019, 6 pages.

*Primary Examiner* — Walter L Lindsay, Jr.
*Assistant Examiner* — Andrew V Do
(74) *Attorney, Agent, or Firm* — Cantor Colburn LLP

(57) ABSTRACT

A sensor package comprising: a sensor, wherein the sensor comprises a sensing structure formed in a material layer and one or more further material layers arranged to seal the sensing structure to form a hermetically sealed sensor unit; a support structure; one or more springs flexibly fixing the hermetically sealed sensor unit to the support structure; wherein the one or more springs are formed in the same material layer as the sensing structure of the sensor unit; and one or more external package wall(s) encapsulating the sensor unit, the support structure, and the one or more springs, wherein the support structure is fixed to at least one of the package wall(s). The springs decouple mechanical stresses between the sensor unit and the external package wall(s) so as to reduce the long term drift of scale factor and bias.

9 Claims, 8 Drawing Sheets

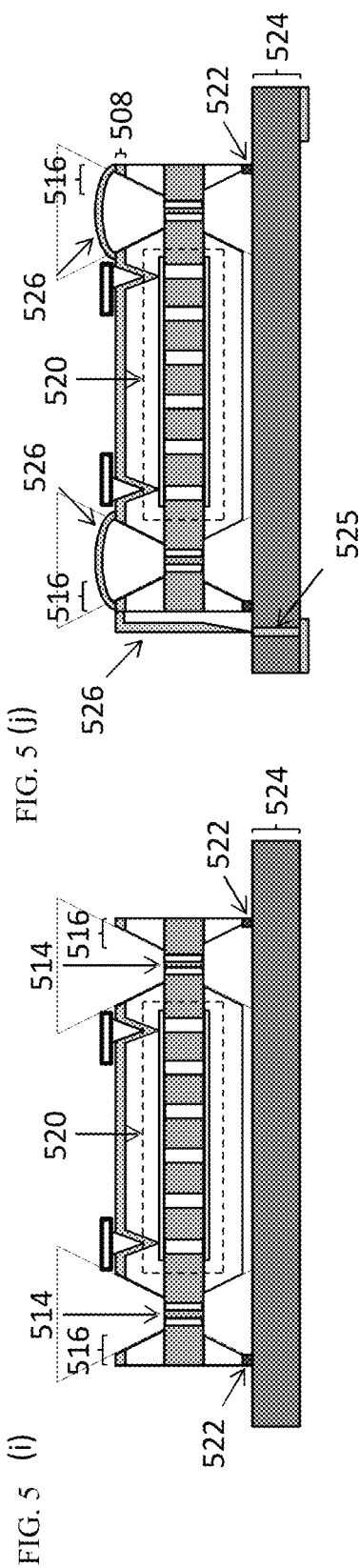

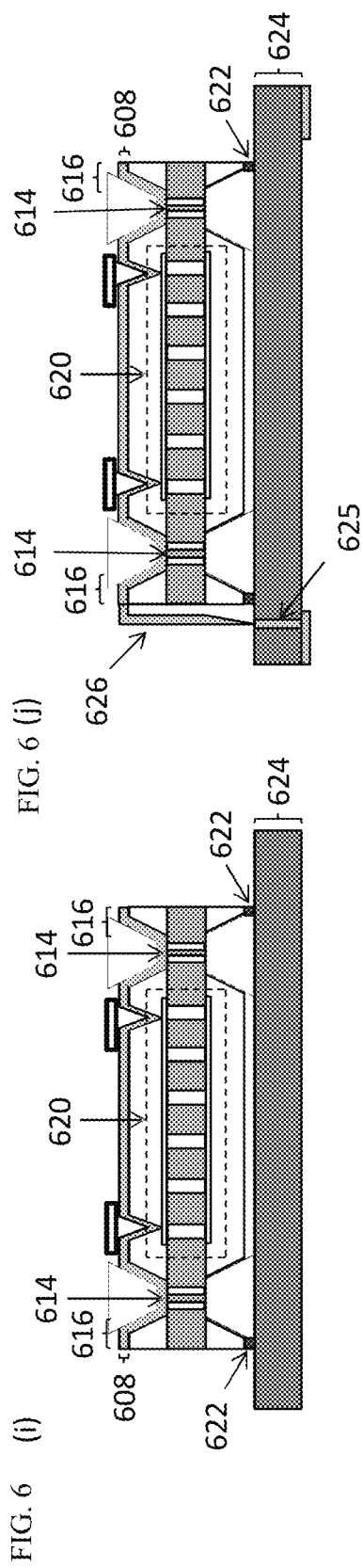
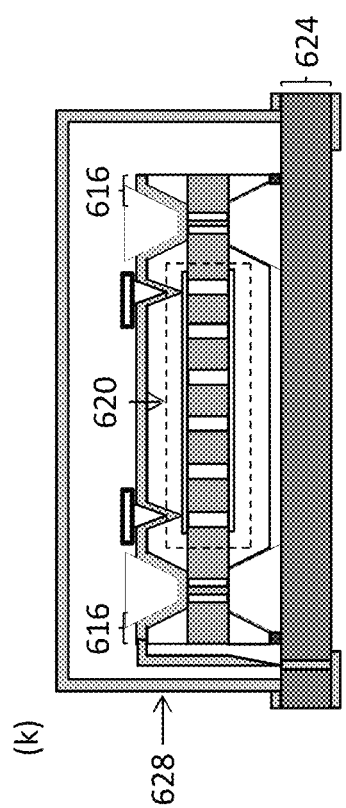
FIG. 6 (i)
FIG. 6 (j)
FIG. 6 (k)

SENSOR PACKAGES

FOREIGN PRIORITY

This application claims priority to Great Britain Patent Application No. 1811925.5 filed Jul. 20, 2018, the entire contents of which is incorporated herein by reference.

TECHNICAL FIELD

The present disclosure relates to sensor packages, in particular to MEMS sensor packages.

BACKGROUND

Sensors, for example pressure sensors or inertial sensors (such as accelerometers and gyroscopes) are used in many applications, including inertial navigation, robotics, avionics, and automobiles. In inertial navigation applications, such sensors may be found in self-contained systems known as "inertial measurement units" (IMUs). IMUs typically contain a plurality of accelerometers and/or gyroscopes, and provide an estimate of an object's travel parameters such as angular rate, acceleration, altitude, position, and velocity, based on the outputs of gyroscope(s) and/or accelerometer(s). Each inertial sensor in an IMU is a self-contained package. An IMU typically consists of accelerometers and gyroscopes sensing in all three axes. This is normally part of an Inertial Navigation System (INS), which adds computation of velocity and position using navigation algorithms. At IMU level, the outputs are usually limited to angular rotation and velocity increments with each sample.

Microelectromechanical systems (MEMS)-based sensors, typically fabricated from a single silicon wafer, can be used e.g. to measure pressure or temperature, or linear or angular motion without a fixed point of reference. MEMS pressure sensors often work on the principle of mechanical deformation of a MEMS structure due to fluid pressure. MEMS gyroscopes, or strictly speaking MEMS angular rate sensors, can measure angular rate by observing the response of a vibrating MEMS structure to Coriolis force. MEMS accelerometers can measure linear acceleration by observing the response of a proof mass suspended on a spring in a MEMS structure. High performance MEMS inertial sensors are defined by their bias and scale factor stability.

A MEMS sensor is usually supported on an isolation layer within its package. For example, an isolation layer of silicone elastomer may be provided between the package and the lowermost glass layer of the MEMS sensor. In some examples, the MEMS sensor may be mounted on an isolation layer including a raft that is connected to the surrounding package via springs or other damping structures. The isolation layer has two main functions: to provide isolation from unwanted external vibrations; and to absorb mechanical stress due to thermal expansion differences between the MEMS sensor and the surrounding package (typically alumina or ceramic).

The stability of the isolation layer that attaches a MEMS inertial sensor to its package is important for high performance, especially when trying to achieve better than 0.1 mg bias stability. An elastomeric isolation layer is usually chosen to have a very low elastic modulus (e.g. silicone) to decouple the MEMS sensor from package stresses. However, such materials suffer from long term creep and ageing effects which can therefore alter sensor performance (e.g. bias and scale factor) by virtue of stress relief over a period of time in service. It is therefore difficult to achieve good isolation of an inertial sensor from package stresses and good long term stability in performance. Similar considerations apply when mounting any MEMS sensor in a package.

There remains a need for improved isolation mounting in sensor packages.

SUMMARY

According to a first aspect of this disclosure, there is provided a sensor package comprising: a sensor, wherein the sensor comprises a sensing structure formed in a material layer and one or more further material layers arranged to seal the sensing structure to form a hermetically sealed sensor unit; a support structure; one or more springs flexibly fixing the hermetically sealed sensor unit to the support structure; wherein the one or more springs are formed in the same material layer as the sensing structure of the sensor unit; and one or more external package wall(s) encapsulating the sensor unit, the support structure, and the one or more springs, wherein the support structure is fixed to at least one of the package wall(s).

According to a second aspect of this disclosure, there is provided a method of manufacturing a sensor package, the method comprising: forming a sensing structure in a material layer; forming one or more springs in the same material layer as the sensing structure; adding one or more further material layers to seal the sensing structure to form a hermetically sealed sensor unit with the one or more springs flexibly fixing the hermetically sealed sensor unit to a support structure; and fixing the support structure to one or more external package wall(s), the one or more external package wall(s) encapsulating the inertial sensor unit, the support structure, and the one or more springs.

DETAILED DESCRIPTION

The present disclosure relates to a sensor package and a method of manufacturing a sensor package. It will be appreciated that forming one or more springs in the same material layer as the sensing structure of the sensor unit is a completely different approach to sensor isolation than the conventional way of mounting the hermetically sealed sensor unit to an external package using a different material, e.g. an elastomeric material, as an isolation layer. The springs can decouple mechanical stresses between the sensor unit and the external package wall(s) so as to reduce the long term drift of scale factor and bias. Furthermore, the effects of temperature sensitivity on bias and scale factor can also be reduced e.g. for an inertial sensor.

Some non-limiting examples of a sensor package and a method of manufacturing a sensor package are described in further detail below.

Figure 1:
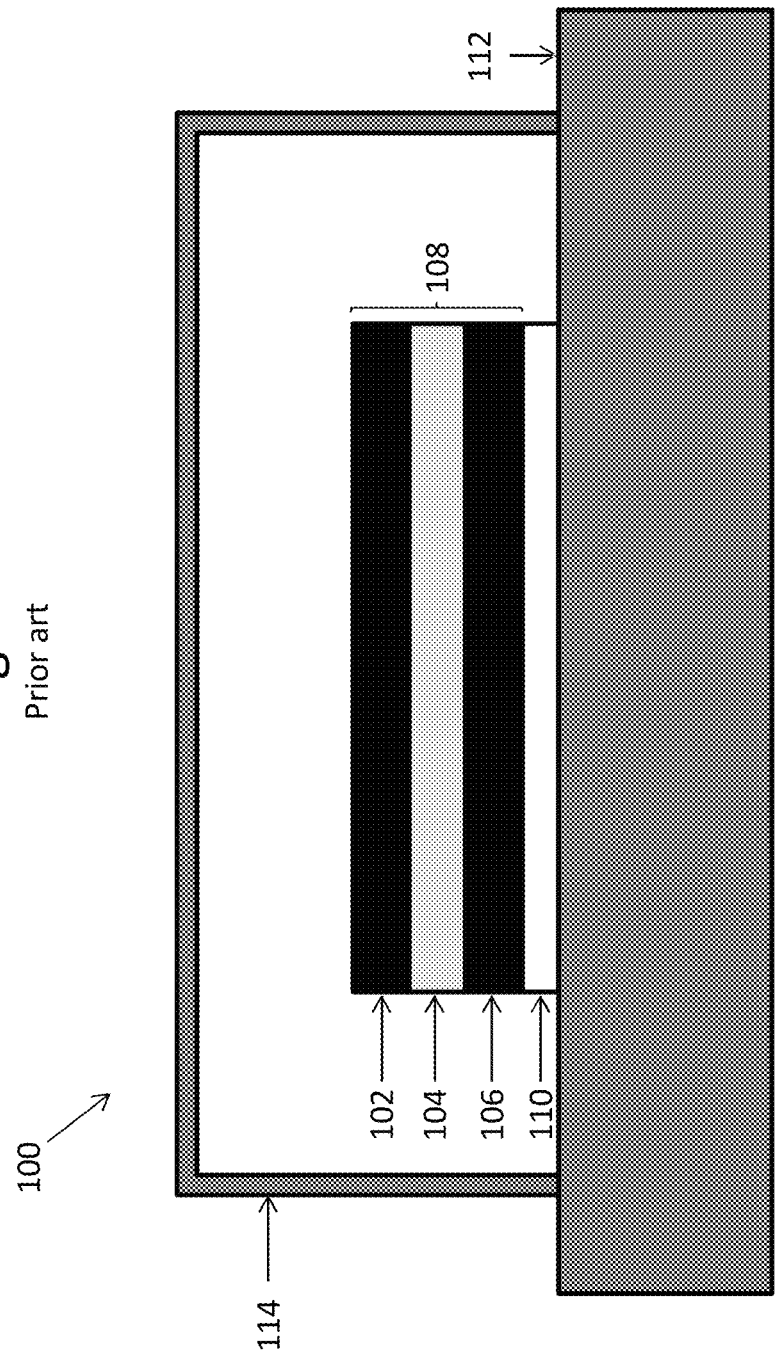
FIG. 1 shows a prior art sensor package that uses a full elastomeric die bond.

FIG. 1 shows a prior art inertial sensor package 100 comprising an upper glass layer 102, a silicon sensing layer 104, a lower glass layer 106, an elastomeric die bond layer 110, an alumina substrate 112, and a package lid 114. The three layers 102, 104 and 106 make up a hermetically sealed inertial sensor unit 108.

The silicon sensing structure in the layer 104 is sensitive to some form of applied force, in this case, acceleration. This silicon sensing layer 104 is sandwiched between the upper glass layer 102 and the lower glass layer 106 to form a hermetically sealed inertial sensor unit 108. This sealing allows for the silicon sensing structure in the layer 104 to occupy a space within a controlled environment. The inside of the hermetically sealed inertial sensor unit 108 comprises an atmosphere that is controlled to optimise sensor performance.

The hermetically sealed inertial sensor unit 108 is attached to the alumina substrate 112 by elastomeric die bond layer 110. As shown, the elastomeric die bond layer 110 covers all of the lower glass layer 106 of the hermetically sealed inertial sensor unit 108. The elastomeric die bond layer 110 is flexible. This provides good adhesion for the hermetically sealed inertial sensor unit 108 to the alumina substrate 112, and further provides good mechanical stability under shock and vibration of the inertial sensor package 100.

However, as described in the background section above, thermal and mechanical stresses across the inertial sensor package 100 can adversely affect the performance of inertial sensor unit 108, especially later in the lifetime of the device.

Package lid 114 allows the hermetically sealed inertial sensor unit 108 to be further protected from external environmental influences, such as dirt or direct force application. Typically, this lid is a metal alloy or alumina and is soldered to the substrate 112. The package formed by lid 114 also forms a hermetic seal, and allows for controlling the gaseous environment inside the package. This is done to ensure an optimal dry gas environment inside the package, and prevents any moisture ingress, which may negatively affect sensor performance, particularly in a capacitive-type inertial sensor.

Figure 2:
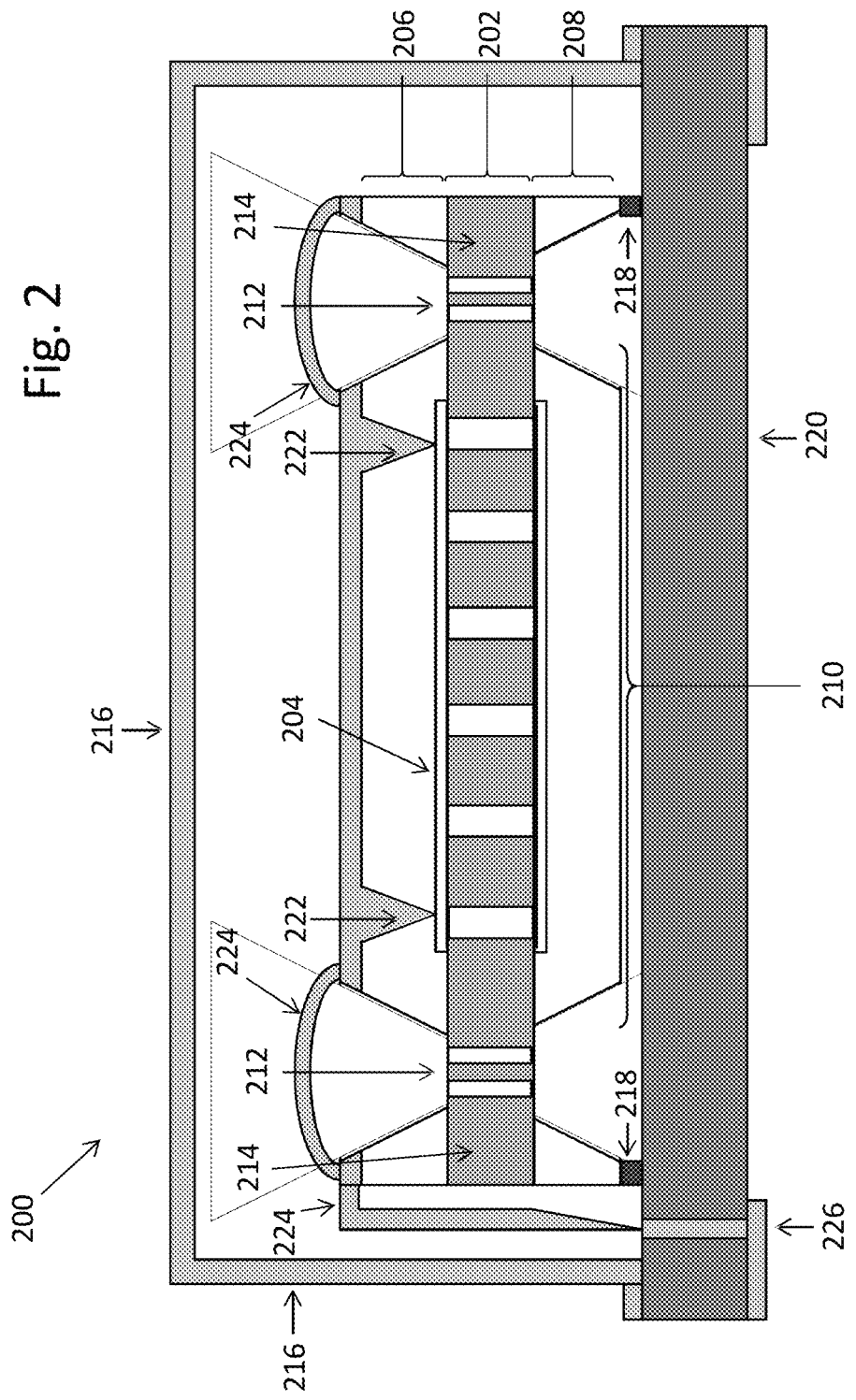
FIG. 2 shows a sensor package in accordance with an example of the present disclosure.

FIG. 2 shows a sensor package, e.g. an inertial sensor package 200 in accordance with an example of the present disclosure. The boundaries of the inertial sensor package 200 are defined by three external walls 216, and a substrate 220. The inertial sensor package 200 comprises a silicon sensing structure 204 formed in a silicon material layer 202 for detecting an applied acceleration. The silicon sensing structure 204 is hermetically sealed into an inertial sensor unit 210, by an upper glass layer 206 and a lower glass layer 208. The inertial sensor package 200 also comprises a support structure 214 formed in the silicon layer 202. The support structure 214 takes the form of a frame surrounding the hermetically sealed inertial sensor unit 210. The support structure 214 is attached to the substrate 220, through the intervening glass layer 208, by a compliant or fixed mount 218. The inertial sensor unit 210 is decoupled from the substrate 220, as it is instead suspended from the support structure 214 by a plurality of springs 212, formed in the silicon material layer 202. In this example, the silicon sensing structure 204 is electrically connected to an external connection 226 via flexible wire bonds 224, and through-hole vias 222 in the upper glass layer 206.

As shown, the sensor unit 210 is decoupled from stresses and sudden forces applied to the package 200 in two ways. Primarily, the springs 212 that join the 'floating' sensor unit 210 to the support structure 214 compensate for any such stresses, leaving the sensor unit 210 free from such imbalances, decreasing long term drift of scale factor and bias. Furthermore, the effects of temperature sensitivity on bias and scale factor can also be reduced. Secondary to the effects of the springs 212, the elastomeric mount 218 can also absorb some stresses and shocks to the package 200. In these ways, sensor performance is improved.

As shown, parts of the support structures 214, the springs 212, and the sensing structure 204 are all made in the same silicon material layer 202. This may have significant benefits to the manufacturing process, as streamlined development can take place, enabling the device to be mostly manufactured before needing to singulate the parts from a wafer. This batch processing of the devices may both increase throughput and decrease cost of manufacture. By manufacturing the devices this way, the sensor unit 210 can be conveniently decoupled from the support structures 214 by etching out the springs 212 during the same process that is used to etch out the sensing structure 204.

An electrical connection is made to the sensing structure 204 with a conductive e.g. metal path passing down the through-hole vias 222. This connection is then carried down to the substrate 220, via the flexible wire bonds 224, to meet the external connections 226 which allow an electrical connection to be made from the outside of the sensor package 200 directly to the sensing structure 204. The flexible wire bonds 224 are flexible enough to withstand any stresses or gradients within the package, for example flexing of the springs 212.

The upper 206 and lower 208 glass layers form a hermetic seal around the sensor unit 210. The environment within the sensor unit 210 can be controlled at the time of sealing, and in this example, the sensor is filled with dry Nitrogen at atmospheric pressure. This controlled environment enables tuning of the damping factor within the hermetically sealed sensor unit 210.

The external walls 216 form a hermetic seal around the support structures 214 and the sensor unit 210. The environment within this area can be controlled upon sealing as well. The control of this environment enables tuning of the damping factor of the squeeze film damping fingers (not shown in FIG. 2), which is explained in more detail below with reference to FIG. 4.

Figure 3:
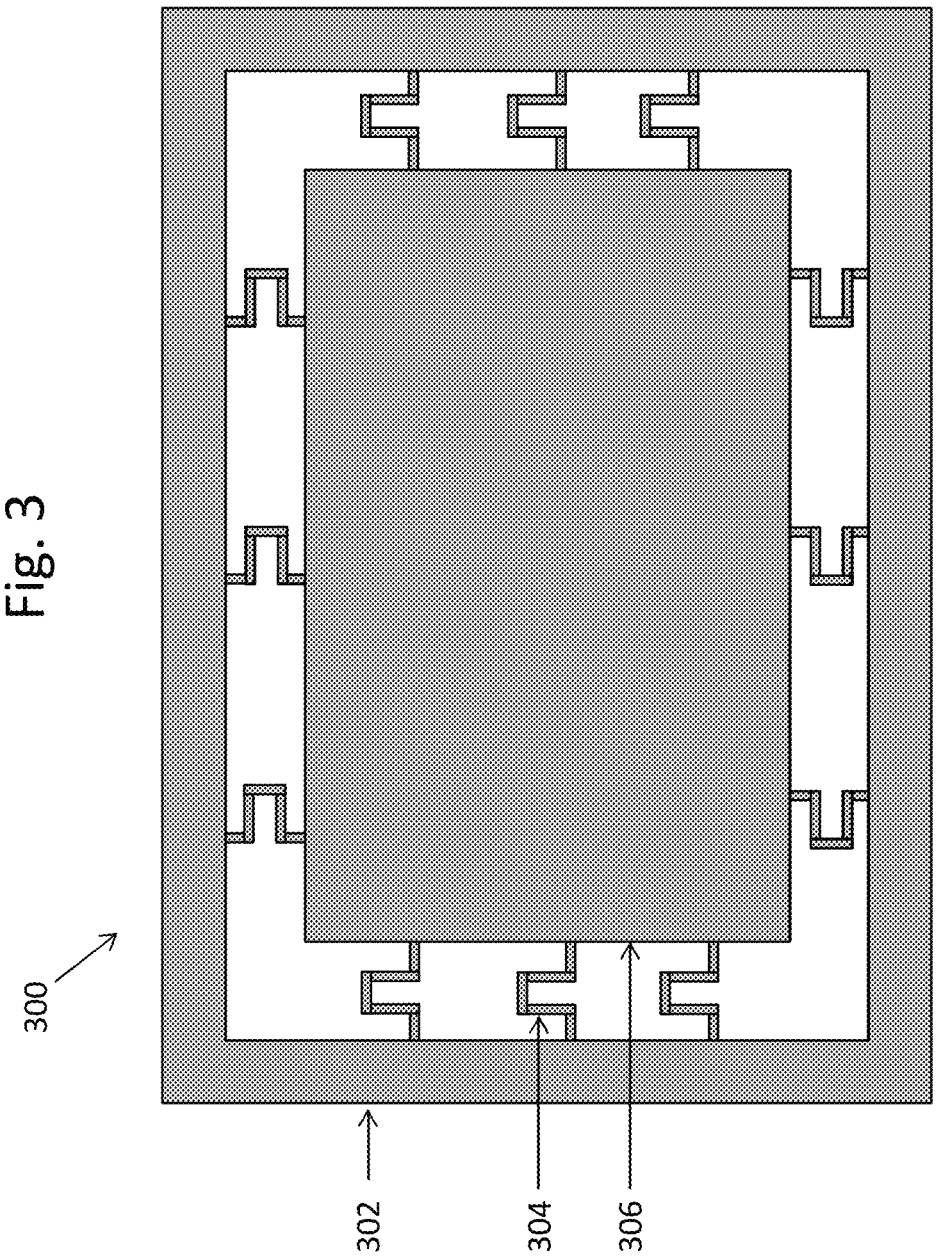
FIG. 3 shows a plan view of a first material layer in accordance with an example of the present disclosure.

FIG. 3 shows a plan view of the first material layer in accordance with an example of the present disclosure. The first material layer is a silicon layer 300. Silicon layer 300 is made from a single sheet of crystalline silicon. The silicon layer 300 comprises a support structure 302, taking the shape of an outer frame, a plurality of springs 304, and a sensing structure 306. There is no residual glass in the spring area. The support structure 302 is a frame surrounding the sensing structure 306.

As shown, the sensing structure 306 is suspended from the support frame 302 by the springs 304. The springs 304 decouple the sensing structure 306 from the mechanical and other stresses experienced by the inertial sensor package 200, whilst having a spring constant such that inertial movement is still transferred to the sensing structure 306. The resonant frequency of the springs 304 is between 1-5 kHz, for example 2 kHz. The length and width of the springs 304 is designed in order to select an optimal resonant frequency. The springs 304 are serpentine in shape, and have a number of serpentine turns, for example between 1-10 turns.

The manufacture of the support structure 302, springs 304 and sensing structure 306 all in a single material layer allows for a streamlined manufacturing process, saving both cost and time.

Figure 4:
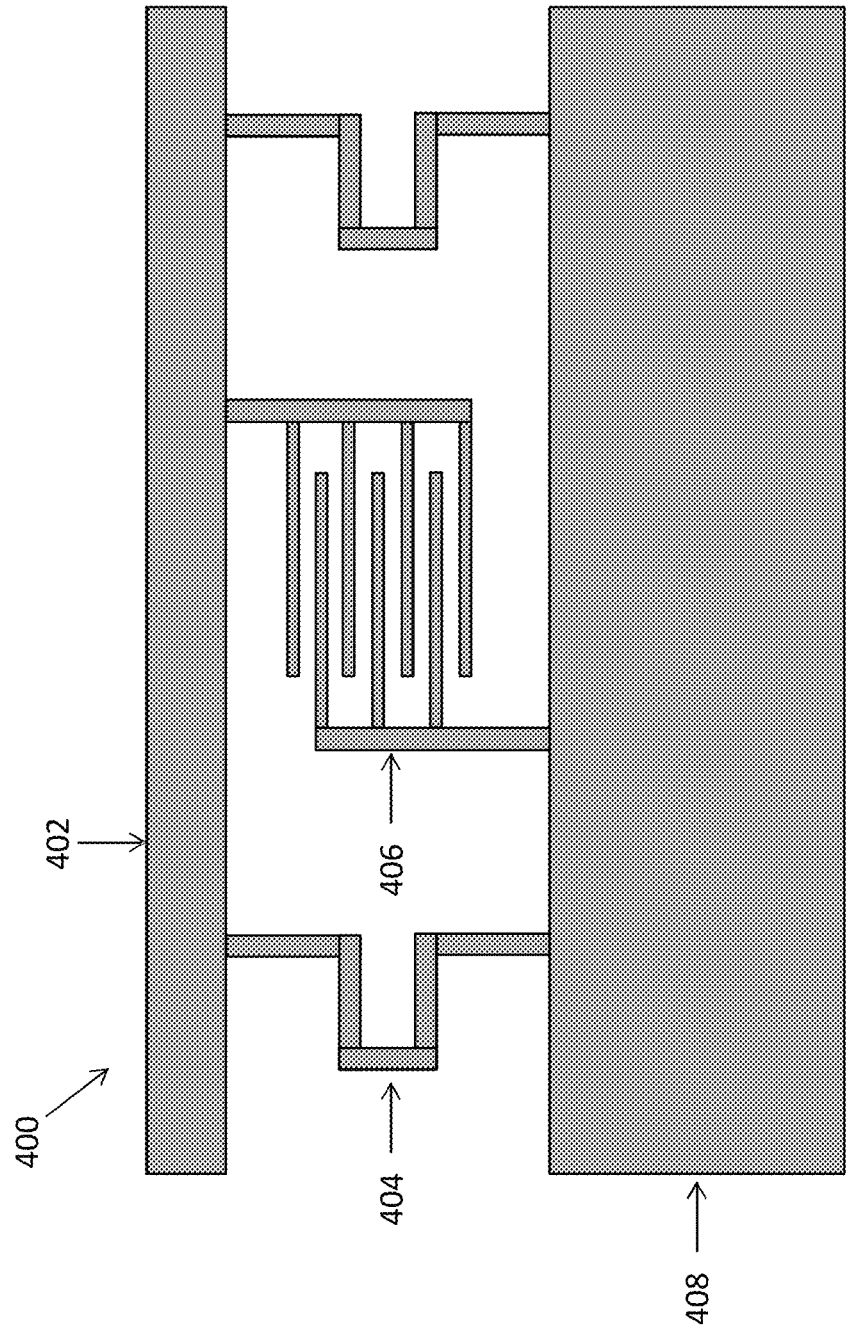
FIG. 4 shows a further plan view of the first material layer, including squeeze damping fingers, in accordance with an example of the present disclosure.

FIG. 4 shows a further plan view of the first material layer 400, including optional squeeze film damping fingers 406, in accordance with an example of the present disclosure. Shown in FIG. 4 is a support structure 402, a sensing structure 408, springs 404, and squeeze film damping fingers 406.

As in FIG. 3, the springs 404 suspend the sensing structure 408 from the support structure 402. The addition of the squeeze film damping fingers 406 assists in the decoupling of mechanical and other stresses between the inertial sensor package and support structure, and the sensing structure 408. The squeeze film damping fingers 406 help to provide near critical damping to the inertial sensor package, preventing the sensing structure 408 from being damaged. The squeeze film damping fingers 406 do this by limiting the range of movement of the sensing structure 408 with respect to the support structure 402.

The damping effect of the squeeze film damping fingers 406 can be tuned by altering the composition of the inertial sensor package environment, for example by filling it with dry Nitrogen, Neon or Argon at atmospheric pressure. The damping effect can also be tuned by adjusting the number of fingers, the lengths of the fingers, and the size of the gaps between the fingers.

FIGS. 5a-5k shows a process for manufacturing a sensor package in accordance with an example of the present disclosure.

Figure 5A:
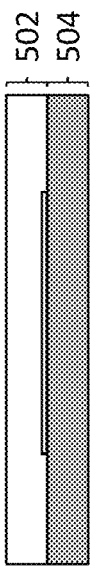
FIGS. 5a-5k show a process for manufacturing a sensor package in accordance with an example of the present disclosure.
Figure 5:

FIG. 5a shows the first step of pre-cavitating a layer of glass 502 with a wet etch. The etch is defined by a mask, and the glass layer 502 is only etched in the region which a moving sensing structure will later occupy. The depth of the etch is typically around 30 µm.

FIG. 5b shows the next step of anodically bonding a silicon wafer 504 to the glass layer 502.

Figure 5C:
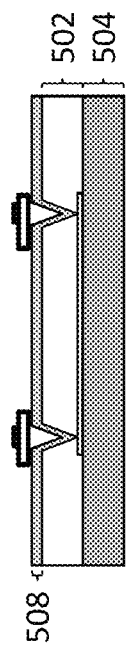
Figure 5:
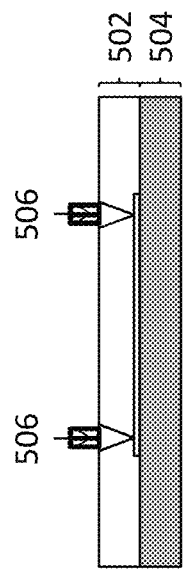

FIG. 5c shows the next step of creating through-hole vias 506. This is typically done by first applying a photomask (not shown), and powder blasting the glass layer 502 in order to create the through-hole vias 506. The through-hole vias 506 go through to the silicon layer 504, inside the pre-cavitated area of the glass layer 502.

FIG. 5d shows the next step of depositing a metal tracking layer 508 onto the glass layer 502, forming a uniform thin layer 508 coating the glass layer 502, and the inside surfaces of the through-hole vias 506 in the process. Alternatively, the metal tracking layer 508 may fill the through-hole vias 506. This allows electrical connections to be made to the silicon layer 504, in order to connect a sensing structure made in the silicon layer 504 with an external package. The metal tracking layer 508 is typically deposited and then patterned by photo-lithography.

Figure 5E:
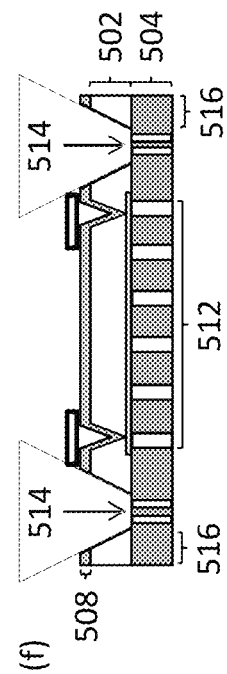
Figure 5:
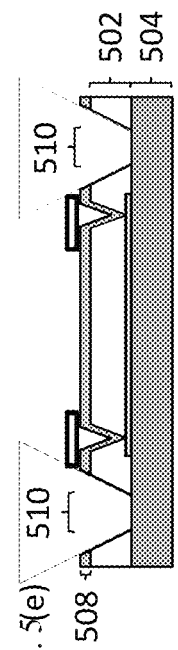
Figure 5:
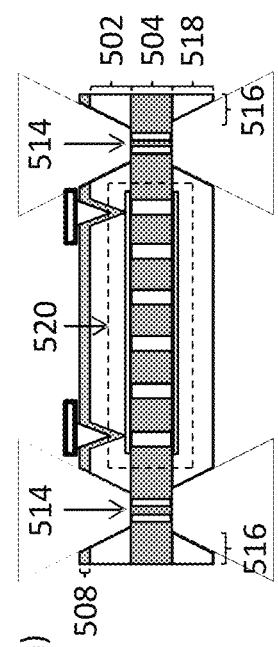
Figure 5:
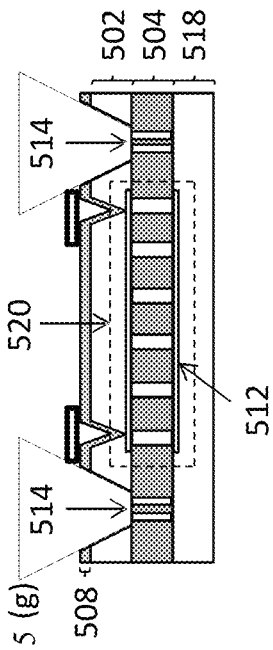

FIG. 5e shows the next step of performing an isotropic wet etch on the glass layer 502, in the regions 510 where the springs will be formed, in order to suspend the sensing structure later formed in the silicon layer 504. A photomask (not shown) is used to protect the other areas from the wet etch. This exposes the underlying silicon layer 504.

FIG. 5f shows the next step of performing a Deep Reactive Ion Etch (DRIE) on the underlying silicon layer 504 from the bottom. A standard photo mask (not shown) is used to define the etched regions of the silicon layer 504. In this step, a sensing structure 512 is etched from the silicon layer 504. This etch also defines a plurality of serpentine springs 514 suspending the sensing structure 512 from the newly defined support structure 516.

Next, a lower glass layer 518 is pre-cavitated in moving regions of the sensing structure 512 in the silicon layer 504. As shown in FIG. 5g, the lower glass layer 518 is then anodically bonded to the silicon layer 504, forming a hermetically sealed sensor unit 520 containing the sensing structure 512. The hermetically sealed sensor unit 520 is back-filled with a gas, typically dry Nitrogen, Argon or Neon at atmospheric pressure. This ensures near critical damping of the sensing structure 512.

FIG. 5h shows the next step of performing an isotropic wet etch on the lower glass layer 518 to the depth of the silicon layer 504. This etch is defined by a photomask (not shown), and leaves only the springs 514 in the regions 510 of FIG. 5(e). This also releases the hermetically sealed sensor unit 520 from the support structure 516, leaving it suspended by the springs 514. This decouples the hermetically sealed sensor unit 520 from any large shocks or stresses experienced by the support structure 516, as they will be absorbed by the springs 514 instead. Furthermore, it will be seen that the sensing structure 512 is hermetically isolated from the springs 514 by the anodically bonded glass layers 502, 518, forming the hermetically sealed sensor unit 520. The device may be singulated from the wafer after this stage too. This allows for streamlining of production of the devices, as the devices are almost fully formed before they are singulated from the wafer.

FIG. 5i shows the next step of bonding the support structures 516 to a substrate 524 (typically made from alumina or ceramic), via one or more elastomeric mounts 522 (for instance). In this way, the hermetically sealed sensor unit 520 is decoupled from any stresses or shocks experienced by the substrate 524 via the springs 514 as well as the elastomeric mounts 522.

FIG. 5j shows the next step of adding flexible wire bonds 526 to the device, thereby attaching the metal tracking layer 508 on the hermetically sealed sensor unit 520 to the (relatively) fixed support structures 516. Furthermore, flexible wire bonds 526 are also added from the support structure 516 to the substrate 524. The wire bonds typically have a diameter of 25 µm. An external electrical connection 525 is also added through the substrate layer 524.

FIG. 5k shows the final step of adding a metal lid 528, hermetically sealing the internal gas volume of the package. This is typically done using solder sealing (at ~300° C.), securing the lid 528 to the substrate 524. The internal gas volume of the package is controlled to optimise the decoupling between the hermetically sealed sensor unit 520 and the support structures 516, and typically comprises Argon, Neon or dry Nitrogen at atmospheric pressure—e.g. to optimise squeeze film damping.

FIGS. 6a-6k show a process for manufacturing a sensor package in accordance with another example of the present disclosure. The manufacturing process shown in FIGS. 6a-6ak is similar to that shown in FIGS. 5a-5k, and will be described below with reference to FIGS. 5a-5k where appropriate.

Figure 6:
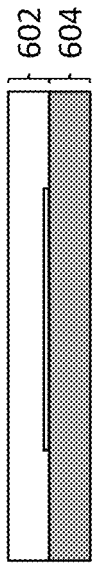
FIGS. 6a-6k show a process for manufacturing a sensor package in accordance with another example of the present disclosure.
Figure 6:
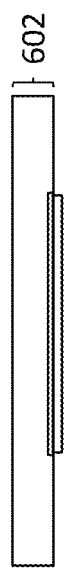
Figure 6:
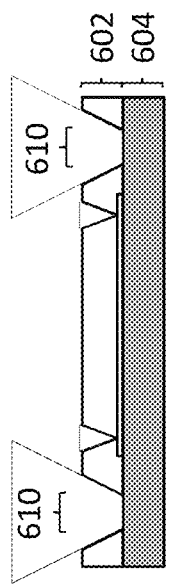
Figure 6:
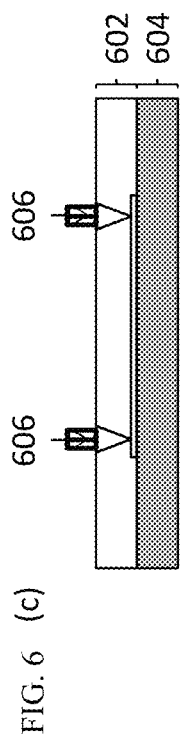
Figure 6:
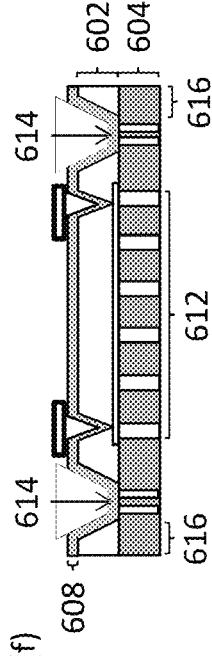
Figure 6:
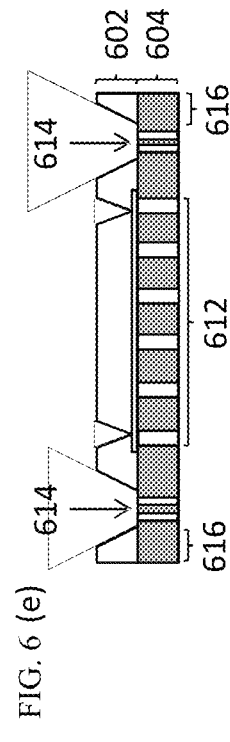
Figure 6:
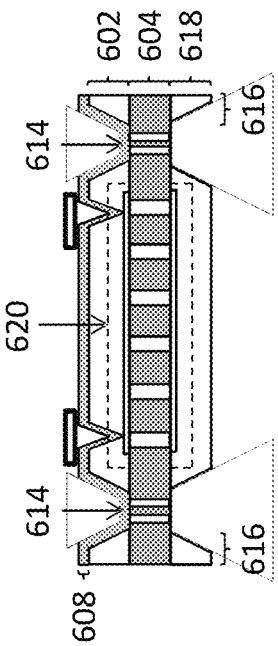
Figure 6:
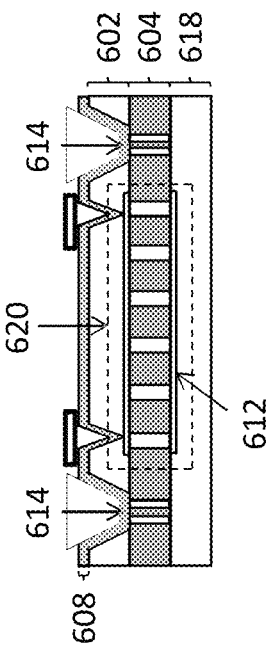

The manufacturing process shown in FIGS. 6a-6c is the same as that shown in FIGS. 5a-5c.

FIG. 6d shows the next step of performing an isotropic wet etch on the glass layer 602, in the regions 610 where the springs will be formed, in order to suspend the sensing structure. A photomask (not shown) is used to protect the other areas from the wet etch. This exposes the underlying silicon layer 604.

FIG. 6e shows the next step of performing a DRIE on the underlying silicon layer 604 from the bottom. A standard photo mask (not shown) is used to define the etched regions of the silicon layer 604. In this step, a sensing structure 612 is etched from the silicon layer 604. This etch also defines the serpentine springs 614 suspending the sensing structure 612 from newly defined support structure 616.

FIG. 6f shows the next step of depositing a metal tracking layer 608 onto the silicon layer 604 and the glass layer 602, forming a uniform thin layer 608 coating the glass layer 602, and the inside surfaces of the through-hole vias 606 in the process. Alternatively, the metal tracking layer 608 may fill the through-hole vias 606. This allows electrical connections to be made to the silicon layer 604, in order to connect a sensing structure made in the silicon layer 604 with an external package. This step also defines metal tracking down the faces of the isotropically etched glass layer 602, and across the surface of the springs 614. This provides an electrically conductive path from the sensing structure 612 and the through-hole vias 606, to the edge of the glass layer 602 where the support structure 616 surrounds the sensing structure 612. The metal tracking layer 608 is typically deposited, and then patterned by photo-lithography.

Next, a lower glass layer 618 is pre-cavitated in moving regions of the sensing structure 612 in the silicon layer 604. As shown in FIG. 6g, the lower glass layer 618 is then anodically bonded to the silicon layer 604, forming a hermetically sealed sensor unit 620 containing the sensing structure 612. The hermetically sealed sensor unit 620 is back-filled with a gas, typically dry Nitrogen, Argon or Neon at atmospheric pressure. This ensures near critical damping of the sensing structure 612.

FIG. 6h shows the next step of performing an isotropic wet etch on the lower glass layer 618 to the depth of the silicon layer 604. This etch is defined by a photomask (not shown), and leaves only the springs 614 and the corresponding metal tracking in the regions 610 of FIG. 6(d). This also releases the hermetically sealed sensor unit 620 from the support structure 616, leaving it suspended by the springs 614. This decouples the hermetically sealed sensor unit 620 from any large shocks or stresses experienced by the support structure 616, as they will be absorbed by the springs 614 instead. Furthermore, it will be seen that the sensing structure 612 is hermetically isolated from the springs 614 by the anodically bonded glass layers 602, 618, forming the hermetically sealed sensor unit 620. The device may be singulated from the wafer after this stage too. This allows for streamlining of production of the devices, as the devices are almost fully formed before they are singulated from the wafer.

FIG. 6i shows the next step of bonding the support structure 616 to a substrate 624 (typically made from alumina or ceramic), via one or more elastomeric mounts 622 (for instance). In this way, the hermetically sealed sensor unit 620 is decoupled from any stresses or shocks experienced by the substrate 624 via the springs 614 as well as the elastomeric mounts 622.

FIG. 6j shows the next step of adding a flexible wire bond 626 to the device, attaching the metal tracking layer 608 at the support structure 616 to the substrate layer 624. The wire bonds typically have a diameter of 25 μm. An external electrical connection 625 is also added through the substrate layer 524. As previously mentioned, this allows for an external electrical connection to be made to the sensing structure 612, but in this example across the electrically conductive paths carried by the springs 614 between the flexible wire bond 626 and the sensor unit 620.

FIG. 6k shows the final step of adding a metal lid 628, hermetically sealing the internal gas volume of the package. This is typically done using solder sealing (at ~300° C.), securing the lid 628 to the substrate 624. The internal gas volume of the package is controlled to optimise the decoupling between the hermetically sealed sensor unit 620 and the support structure 616, and typically comprises Argon, Neon or dry Nitrogen at atmospheric pressure—e.g. to optimise squeeze film damping.

It will be appreciated that forming one or more springs in the same material layer as the sensing structure provides for ease of manufacture while also decoupling mechanical and thermal stresses between the sensor unit and the external package wall(s). More generally, some examples of a sensor package and a method of manufacturing a sensor package according to the present disclosure are provided below.

According to one or more examples of the present disclosure, the one or more springs may have a serpentine form. The geometrical form of the springs may be designed to provide a predefined spring compliance or stiffness. In at least some examples, the one or more springs are configured to provide a spring resonance ≥1 kHz and preferably in the range of 1-5 kHz. This has been found by the inventors to give enough compliance without compromising sensor performance at lower frequency.

According to one or more examples of the present disclosure, the one or more springs preferably comprises a plurality of springs. The springs may be arranged around the sensor unit. For example, the sensor unit may be arranged centrally within the support structure and the springs may extend in multiple directions between the sensor unit and the support structure. The support structure may be in the same plane as the sensor unit or in a different plane, above and/or below the sensor unit. In one or more examples, the sensor unit may be suspended by the springs fixing the sensor unit to the support structure.

According to one or more examples of the present disclosure, the material layer in which the sensing structure is formed comprises silicon. The one or more springs may therefore be formed in the same silicon layer as the sensing structure of the sensor unit. The silicon springs can be shaped and/or dimensioned to give radial compliance to allow for stress relief between the sensor unit and the support structure. The silicon springs may conveniently be etched out during the same process that is used to etch out the sensing structure. For example, the one or more springs may be formed by etching a serpentine form in the silicon material layer.

According to one or more examples of the present disclosure, the hermetically sealed sensor unit comprises a glass layer, a silicon material layer comprising the sensing structure, and a further glass layer. Such a material structure is known as a silicon-on-glass (SOG) structure. The one or more further material layers arranged to seal the sensing structure to form a hermetically sealed sensor unit may therefore be glass layer(s).

According to one or more examples of the present disclosure, the hermetically sealed sensor unit comprises a silicon layer, a silicon material layer comprising the sensing structure, and a further silicon layer. The one or more further material layers arranged to seal the sensing structure to form a hermetically sealed sensor unit may therefore be silicon layer(s).

According to one or more examples of the present disclosure, the support structure is formed in the same material layer as the sensing structure of the sensor unit and the spring(s). In such examples the support structure is in the same plane as the material layer. This means that the support structure may be conveniently decoupled from the sensing structure by etching out the spring(s) during the same process that is used to etch out the sensing structure. The support structure may therefore be formed from silicon, the same as the sensing structure.

According to one or more examples of the present disclosure, the support structure is a frame. The frame may surround the hermetically sealed sensor unit. As mentioned above, a plurality of the springs may extend between the sensor unit and the frame e.g. suspending the sensor unit centrally within the frame.

According to one or more examples of the present disclosure, the support structure is fixed to at least one external package wall via a compliant (e.g. elastomeric) mount. Such an elastomeric mount may provide a degree of compliance, but it will be appreciated that the main decoupling between the sensor unit and the support structure is through the one or more springs. The compliant mount may require much less elastomeric material than the conventional elastomeric isolation layer used in prior art sensor packages.

According to one or more alternative examples of the present disclosure, the support structure is fixed to at least one external package wall via a rigid mount. It will be appreciated that a rigid mount may be used as the sensor unit is already decoupled from the support structure through the one or more springs. The rigid mount may comprise an adhesive e.g. epoxy bond or a metal solder joint.

According to one or more examples of the present disclosure, the sensor package further comprises a squeeze film damping structure arranged between the hermetically sealed sensor unit and the support structure. Such a damping structure comprises one or more gaps that are sized so as to provide a squeeze film damping effect in the gaseous atmosphere within the package, as is known in the art. For example, the squeeze film damping structure may comprise a plurality of interdigitated damping fingers. The plurality of interdigitated damping fingers may be arranged in one or more sets, for example multiple sets arranged around the sensor unit.

According to one or more examples of the present disclosure, the squeeze film damping structure is formed in the same material layer as the sensing structure of the sensor unit and the spring(s). This means that the squeeze film damping structure may conveniently be formed during the same process that is used to etch out the sensing structure and the spring(s). The squeeze film damping structure (e.g. interdigitated damping fingers) may therefore be formed from silicon, the same as the sensing structure.

According to one or more examples of the present disclosure, the hermetically sealed sensor unit is evacuated. According to one or more alternative examples of the present disclosure, the hermetically sealed sensor unit comprises a first gaseous environment e.g. comprising one or more of Argon, Neon or dry Nitrogen. The first gaseous environment may be at a pressure below atmospheric pressure, e.g. partially evacuated. Alternatively, the first gaseous environment may be at a pressure above atmospheric pressure. This elevated pressure may give a higher damping factor.

According to one or more examples of the present disclosure, the sensor package comprises a second gaseous environment outside the hermetically sealed sensor unit, e.g. made up of one or more of Argon, Neon or dry Nitrogen. The second gaseous environment may be at atmospheric pressure. In examples wherein a squeeze film damping structure is arranged between the hermetically sealed sensor unit and the support structure, the second gaseous environment may be chosen to provide the desired squeeze film damping effect.

According to one or more examples of the present disclosure, the sensor package further comprises flexible wire bonds electrically connecting the sensor unit to at least one of the external package wall(s). The hermetically sealed sensor unit may further comprise one or more through-hole vias for electrical connection to the sensing structure. This means that direct wire bonds may pass down the through-hole vias to provide for electrical connection of the sensing structure.

According to one or more examples of the present disclosure, the hermetically sealed sensor unit is electrically connected to at least one of the external package wall(s) by an electrically conductive path carried by the one or more springs. For example, conductive (e.g. metal) tracking may be carried by the one or more springs. The hermetically sealed sensor unit may further comprise one or more through-hole vias for electrical connection to the sensing structure. This means that direct wire bonds may pass down the through-hole vias to provide for electrical connection of the sensing structure. This connection can then be linked to the electrically conductive path carried by the one or more springs in order to provide an electrical connection from at least one of the external package walls to the sensing structure.

According to one or more examples of the present disclosure, the sensor is a MEMS sensor.

According to one or more examples of the present disclosure, the sensor is a pressure sensor. According to one or more other examples of the present disclosure, the sensor is an inertial sensor. It follows that the hermetically sealed sensor unit may be a hermetically sealed inertial sensor unit.

According to one or more examples of the present disclosure, the inertial sensor is a gyroscope. The sensing structure may comprise a proof mass in the form of a disc or ring. The gyroscope may be a vibrating structure gyroscope.

According to one or more examples of the present disclosure, the inertial sensor is an accelerometer. The sensing structure may comprise a fixed substrate and a proof mass mounted to the fixed substrate by flexible support legs.

According to one or more further examples of the present disclosure, the accelerometer is one of the following: a capacitive accelerometer, an inductive accelerometer, or a piezoelectric accelerometer. In at least some examples, the capacitive accelerometer comprises: a fixed substrate and a proof mass mounted to the fixed substrate by flexible support legs for in-plane movement along a sensing axis in response to an applied acceleration; the proof mass comprising a plurality of sets of moveable electrode fingers extending substantially perpendicular to the sensing axis and spaced apart along the sensing axis; at least two pairs of fixed capacitive electrodes, wherein a first pair of the fixed capacitive electrodes comprises a first fixed electrode and a fourth fixed electrode, and a second pair of the fixed capacitive electrodes comprises a second fixed electrode and a third fixed electrode, and wherein each fixed capacitive electrode comprises a set of fixed capacitive electrode fingers extending substantially perpendicular to the sensing axis and spaced apart along the sensing axis; wherein the sets of fingers of the first and third fixed electrodes are arranged to interdigitate with the sets of moveable electrode fingers with a first offset in one direction along the sensing axis from a median line between adjacent fixed fingers, and the sets of fingers of the second and fourth fixed electrodes are arranged to interdigitate with the sets of moveable electrode fingers with a second offset in the opposite direction along the sensing axis from a median line between adjacent fixed fingers.

In one or more examples, the method may further comprise: forming the support structure in the same material layer as the sensing structure of the inertial sensor unit and the one or more springs. As is mentioned above, this is advantageous as the support structure, spring(s) and sensing structure may all be formed from the same material layer by a common manufacturing process such as DRIE.

In one or more examples, the method may further comprise: connecting flexible wire bonds between the sensor unit and at least one of the external package wall(s).

In one or more examples, the method may further comprise: forming an electrically conductive path across the one or more springs. The electrically conductive path may be formed such that the hermetically sealed sensor unit is electrically connected to at least one of the external package wall(s). For example, the method may further comprise: adding conductive (e.g. metal) tracking to a surface of the one or more springs. The electrically conductive path may be used to take a signal from the sensing structure to the outer frame.

In one or more examples, the method may further comprise: forming a squeeze film damping structure between the hermetically sealed inertial sensor unit and the support structure. Preferably the squeeze film damping structure is formed in the same material layer as the sensing structure of the inertial sensor unit and the spring(s).

The invention claimed is:

1. A sensor package comprising:
a sensor, wherein the sensor comprises a sensing structure formed in a material layer and one or more further material layers arranged to seal the sensing structure to form a hermetically sealed sensor unit;
a substrate;
a support structure;
one or more springs flexibly fixing the hermetically sealed sensor unit to the support structure;
wherein the one or more springs are formed in the same material layer as the sensing structure of the hermetically sealed sensor unit;
one or more external package wall(s) encapsulating the hermetically sealed sensor unit, the support structure, and the one or more springs;
wherein the support structure is fixed to the substrate; and
a squeeze film damping structure arranged between the hermetically sealed inertial sensor unit and the support structure.

2. The sensor package of claim 1, wherein the one or more springs have a serpentine form.

3. The sensor package of claim 1, wherein the support structure is formed in the same material layer as the sensing structure of the hermetically sealed sensor unit and the one or more springs.

4. The sensor package of claim 1, wherein the support structure is a frame surrounding the hermetically sealed sensor unit.

5. The sensor package of claim 1, wherein the support structure is fixed to the substrate via a rigid mount.

6. The sensor package of claim 1, wherein the squeeze film damping structure comprises a plurality of interdigitated damping fingers.

7. The sensor package of claim 6, wherein the squeeze film damping structure is formed in the same material layer as the sensing structure of the hermetically sealed sensor unit and the spring(s).

8. The sensor package of claim 1, further comprising flexible wire bonds electrically connecting the hermetically sealed sensor unit to at least one of the external package wall(s).

9. The sensor package of claim 1, wherein the hermetically sealed sensor unit is electrically connected to at least one of the external package wall(s) by an electrically conductive path carried by the one or more springs.

* * * * *